United States Patent [19]
Edwards

[11] Patent Number: 5,157,587
[45] Date of Patent: Oct. 20, 1992

[54] SEALING ARRANGEMENT
[75] Inventor: William E. Edwards, Barrington, Ill.
[73] Assignee: Motorola, Schaumburg, Ill.
[21] Appl. No.: 632,902
[22] Filed: Dec. 24, 1990
[51] Int. Cl.⁵ ............................................. H05K 7/00
[52] U.S. Cl. ..................... 361/386; 361/389; 361/394; 361/395; 174/16.3; 174/52.2; 357/81
[58] Field of Search ............... 361/386, 387, 388, 389, 361/392, 394, 395; 174/16.3, 52.2, 52.5; 357/74, 81; 165/185

[56] References Cited
U.S. PATENT DOCUMENTS
5,021,736   6/1991   Gonsalves et al. ............... 324/202

Primary Examiner—Leo P. Picard
Assistant Examiner—Young S. Whang

[57] ABSTRACT

An automotive electronic module (22) including a sealing arrangement having a power transistor (4) attached to a printed circuit board (2); a sealing compound layer (18) encapsulating the transistor; a heat sink (8) contacting the transistor and extending through the sealing compound at a surface of the sealing compound remote from the transistor; and a flange (10) formed of flexible material secured to the heat sink and extending into the sealing compound from beyond the surface. The flange prevents loss of adhesion due to differential thermal expansion between the sealing compound and the heat sink (which could create a path for water ingress) by (i) intercepting the force caused by thermal contraction of the sealing compound, (ii) providing increased surface area for the sealing compound to adhere to, and (iii) re-distributing the thermal contraction force through its flexibility and that of the potting compound and the increased surface area of adhesion. The flange also increases the path that water would have to travel to reach a sensitive area.

19 Claims, 1 Drawing Sheet

SEALING ARRANGEMENT

FIELD OF THE INVENTION

This invention relates to sealing arrangements and particularly, though not exclusively, to sealing arrangements in electronic modules for use in automobiles.

BACKGROUND OF THE INVENTION

In a typical electronic module for use in an automobile, electronic components carried on a printed circuit board are sealed by encapsulation within a layer of potting compound. Commonly in such a module, certain components such as power transistors are attached to heat sinks which extend through the potting compound layer. In use of such modules, the potting compound may lose adhesion to the heat sink due to stress caused by incompatible thermal expansions during deep thermal cycles. The separation caused by this loss of adhesion can act as a leakage path for the ingress of external water to the module, causing malfunction.

SUMMARY OF THE INVENTION

It is an object of the present invention to provide an improved sealing arrangement for an electronic module for use in an automobile wherein the above disadvantage may be overcome or at least alleviated.

In accordance with the present invention there is provided a sealing arrangement for an electronic module for use in an automobile, the arrangement comprising:

at least one component;
a sealing compound encapsulating the at least one component; and
a first member associated with the at least one component and extending through the sealing compound at a surface of the sealing compound remote from the at least one component,
the improvement comprising a second member secured to the first member beyond the surface and extending into the sealing compound therefrom.

In a preferred embodiment the first member takes the form of a transistor heat sink and the second member is a flange of flexible material secured to the heat sink. The flange prevents loss of adhesion due to differential thermal expansion between the sealing compound and the heat sink (which could create a path for water ingress) by (i) intercepting the force caused by thermal contraction of the sealing compound, (ii) providing increased surface area for the sealing compound to adhere to, and (iii) re-distributing the thermal contraction force through its flexibility and that of the potting compound and the increased surface area of adhesion. The flange also increases the path that water would have to travel to reach a sensitive area.

BRIEF DESCRIPTION OF THE DRAWINGS

One automotive electronic module sealing arrangement incorporating the invention will now be described, by way of example only, with reference to the accompanying drawings, in which.

DESCRIPTION OF THE PREFERRED EMBODIMENT

Figure 1:
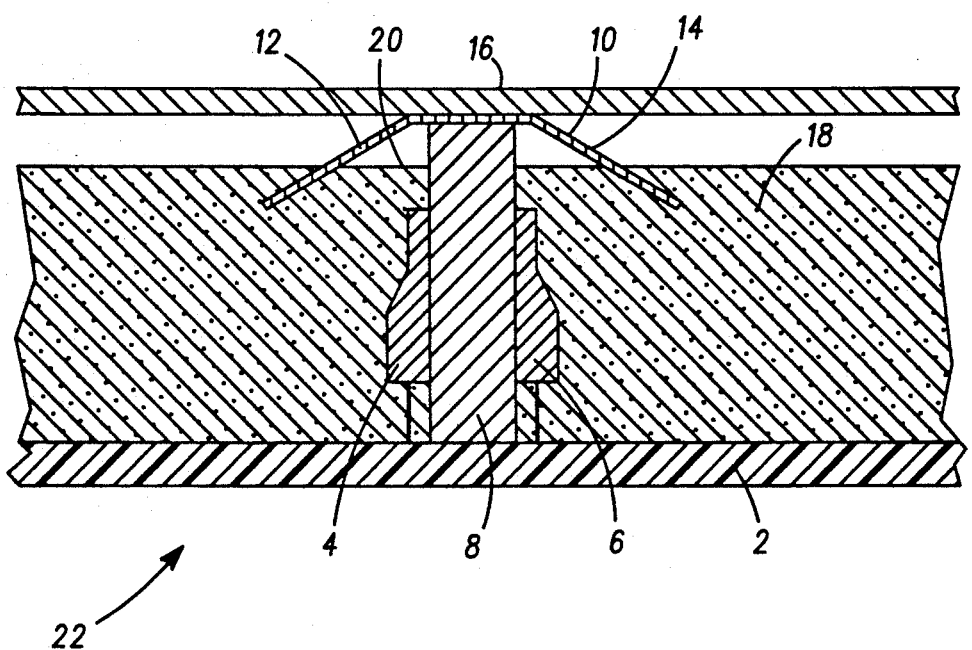
FIG. 1 shows a part cross-sectional, side elevational view of portion of the automotive electronic module.

Referring now the drawings, a planar printed circuit board 2 has mounted on it a number of electronic components, constituting an electronic circuit, including power transistors 4 and 6. The transistors 4 and 6 are packaged in conventional TO-222 packages, having their leads soldered to the board and having their bodies extending perpendicularly to the plane of the board. The transistors 4 and 6 are in contact with a heat sink 8 which, like the transistors, is mounted on the printed circuit board 2 and extends out of the plane of the board. The heat sink 8 extends from the board beyond the transistors 4 and 6.

For reasons which will be explained below, the heat sink 8 is provided at its end remote from the board 2 with a spreader or flange 10. The flange 10 extends around the heat sink 8 and is angled shallowly towards the board 2. The flange 10 thus has portions 12 and 14 which extend to the heat sink's left and right as seen in FIG. 1 at a shallow angle towards the board 2 and portions (not shown) which extend into and out of the plane of FIG. 1 and are similarly angled towards the board 2. The flange 10 may be formed integrally with the heat sink 8 or may be formed, for example, from thin sheet metal material which has been bent to shape and which is attached to the end of the heat sink 8, e.g. by adhesive. Alternatively, the flange 10 may be held to the heat sink 8 by abutment between the heat sink 8 and a housing 16 in which the circuit board is ultimately enclosed (as will be explained below) to form a packaged module.

When all of the components, including the transistors 4 and 6, have been soldered to the board to form the circuit, the board is sealed with a thick layer of conventional potting compound 18 which covers and encapsulates all of the components. The potting compound layer 18 completely covers the components such as the transistors 4 and 6, but it does not completely cover the heat sink 8, the end of which extends through the potting compound layer at a surface 20. The flange 10 thus has its center clear of the potting compound layer and has its angled portions 12 and 14 (and also the unshown portions extending into and out of the plane of FIG. 1) extending towards their extremities into the potting compound layer 18. The potting compound adheres to all the surfaces which it contacts: the printed circuit board 2, the components such as the transistors 4 and 6, the heat sink 8 and the extremities of the angled portions of the flange 10. The potting compound layer 18 is allowed to set in order, as is well known, to provide protection for the components from adverse environmental conditions and to provide a measure vibrational damping which together enhance the physical integrity of the circuit. When the potting compound layer is set, the printed circuit board 2 is enclosed in the housing 16 to form a packaged module 22. If the flange 10 is to be held in position by abutment between the heat sink 8 and the housing 16, the printed circuit board 2 is enclosed in the housing 16 before the potting compound is fully set, and setting then takes place with the printed circuit board 2 enclosed in the housing 16.

In use of the module 22 the circuit board 2 and its components are typically subjected to thermal cycles which may be deep and which generate, in proportion to their depth, stresses at surfaces adhering to the potting compound due to differential thermal expansion between the different materials used. After a number of deep thermal cycles the thermal stresses may cause loss of adhesion of the potting compound. In the case of components which are completely enclosed within the potting compound this loss of adhesion may not significantly reduce the physical integrity of the module since the components would still be completely enclosed even though adhesion would be lost, but in the case of the heat sink 8 which extends through the potting compound layer 18 the loss of adhesion to the potting compound would create a gap beginning at the surface 20 which could act as a path for the ingress of external factors such as water would cause the malfunction or failure of one of the transistors 4 or 6 or other components which it might reach.

However, the flange 10 serves to enhance retention of adhesion between the heat sink 8 and the potting compound, and so reduces the possibility of malfunction or failure of the module, in the following ways:

(i) the flange 10 intercepts the force caused by thermal contraction of the potting compound;

(ii) the flange 10 provides increased surface area for the potting compound to adhere to; and (iii) the flange 10 re-distributes the thermal contraction force through its flexibility and that of the potting compound and the increased surface area of adhesion.

It will also be appreciated that in addition to reducing the possibility of malfunction or failure of the module by enhancing retention of adhesion between the heat sink 8 and the potting compound, the flange 10 also increases the path that water would have to travel to reach a sensitive area, so further reducing the possibility of malfunction or failure of the module.

It will be appreciated that various other modifications or alternatives to the above described embodiment will be apparent to a person skilled in the art without departing from the inventive concept.

What is claimed is:

1. A sealing arrangement for an electronic module for use in an automobile, the arrangement comprising:
   at least one component;
   a sealing compound encapsulating the at least one component; and
   a first member associated with the at least one component and extending through the sealing compound at a surface of the sealing compound remote from the at least one component,
   the improvement comprising a second member secured to the first member beyond the surface and extending therefrom into the sealing compound.

2. The sealing arrangement according to claim 1 wherein the component is attached to a printed circuit board.

3. The sealing arrangement according to claim 1 wherein the component is a power transistor.

4. The sealing arrangement according to claim 1 wherein the first member is a heat sink.

5. The sealing arrangement according to claim 1 wherein the second member is a flange formed of flexible sheet material.

6. The electronic module for use in an automobile, the module including a sealing arrangement comprising:
   at least one component;
   a sealing compound encapsulating the at least one component; and
   a first member associated with the at least one component and extending through the sealing compound at a surface of the sealing compound remote from the at least one component;
   the improvement comprising a second member secured to the first member beyond the surface and extending therefrom into the sealing compound.

7. An electronic module according to claim 6 wherein the component is attached to a printed circuit board.

8. The electronic module according to claim 6 wherein the component is a power transistor.

9. The electronic module according to claim 6 wherein the first member is a heat sink.

10. The electronic module according to claim 6 further including a housing, wherein the second member is secured to the first member by being held between the first member and the housing.

11. The electronic module according to claim 6 wherein the first member is a flange formed of flexible sheet material.

12. An electronic module for use in an automobile, the module including a sealing arrangement comprising:
    at least one component;
    a sealing compound encapsulating the at least one component; and
    a heat sink associated with the at least one component and extending through the sealing compound at a surface of the sealing compound remote from the at least one component, the improvement comprising a flange formed of flexible material secured to the heat sink and extending into the sealing compound from beyond the surface.

13. The electronic module according to claim 12 wherein the component is attached to a printed circuit board.

14. The electronic module according to claim 12 wherein the component is a power transistor.

15. The electronic module according to claim 12 further including a housing, wherein the flange is secured to the first member by being held between the first member and the housing.

16. A sealing arrangement for an electronic module for use in an automobile, the arrangement comprising:
    at least one component;
    a sealing compound encapsulating the at least one component; and
    a first member associated with the at least one component and extending through the sealing compound at a surface of the sealing compound remote from at the least one component;
    the improvement comprising a flange formed of flexible sheet material secured to the first member beyond the surface and extending therefrom into the sealing compound.

17. The sealing arrangement according to claim 16 wherein the component is attached to a printed circuit board.

18. The sealing arrangement according to claim 16 wherein the component is a power transistor.

19. The sealing arrangement according to claim 16 wherein the first member is a heat sink.

* * * * *